US008917121B2

(12) United States Patent
Huang et al.

(10) Patent No.: US 8,917,121 B2
(45) Date of Patent: Dec. 23, 2014

(54) OUTPUT STAGE CIRCUIT

(71) Applicant: NOVATEK Microelectronics Corp., Hsin-Chu (TW)

(72) Inventors: Ju-Lin Huang, Hsinchu County (TW); Keko-Chun Liang, Hsinchu (TW); Chun-Yung Cho, Hsinchu County (TW); Cheng-Hung Chen, Hsinchu County (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 13/717,648

(22) Filed: Dec. 17, 2012

(65) Prior Publication Data

US 2013/0241631 A1 Sep. 19, 2013

(30) Foreign Application Priority Data

Mar. 14, 2012 (TW) ............................ 101108685 A

(51) Int. Cl.
*H03B 1/00* (2006.01)
*G05F 3/16* (2006.01)

(52) U.S. Cl.
CPC ........................................ *G05F 3/16* (2013.01)
USPC ........................................... 327/112; 327/561

(58) Field of Classification Search
CPC ...................................................... H03K 3/023
USPC ......... 327/108, 109, 110, 111, 112, 534, 561, 327/562, 563; 330/255, 261, 267
See application file for complete search history.

(56) References Cited

U.S. PATENT DOCUMENTS

| | | | | |
|---|---|---|---|---|
| 6,424,219 | B1 * | 7/2002 | Kato | 330/255 |
| 6,489,829 | B1 * | 12/2002 | Yu | 327/379 |
| 6,747,502 | B2 * | 6/2004 | Yamamoto | 327/333 |
| 7,116,539 | B2 * | 10/2006 | Twari et al. | 361/111 |
| 7,288,978 | B2 * | 10/2007 | Suzuki et al. | 327/261 |
| 7,821,806 | B2 * | 10/2010 | Horiuchi | 365/104 |
| 7,978,010 | B2 * | 7/2011 | Lee | 330/255 |
| 8,289,079 | B2 * | 10/2012 | Nishimura | 330/260 |
| 2011/0032240 | A1 | 2/2011 | Wang | |

FOREIGN PATENT DOCUMENTS

TW 201008115 2/2010

* cited by examiner

*Primary Examiner* — Jeffrey Zweizig
(74) *Attorney, Agent, or Firm* — Winston Hsu; Scott Margo

(57) ABSTRACT

An output stage circuit includes: a first transistor, including a first terminal coupled to a first node, a second terminal coupled to an output terminal, a third terminal coupled to an input terminal for receiving an input voltage, and a fourth terminal coupled to a first power terminal for receiving a first voltage; a second transistor, including a first terminal coupled to a second node, a second terminal coupled to the output terminal, a third terminal coupled to the input terminal for receiving the input voltage, and a fourth terminal coupled to ground; and a current source, coupled to the output terminal for providing a constant current.

15 Claims, 4 Drawing Sheets

OUTPUT STAGE CIRCUIT

BACKGROUND OF THE INVENTION

1. Field of the Invention

The present invention relates to an output stage circuit, and more particularly, to an output stage circuit capable of eliminating the body effect and applied in a half supply voltage structure.

2. Description of the Prior Art

An operational amplifier (op-amp) is a basic circuit component, frequently used in analog integrated circuits. For reducing power consumption, the conventional operational amplifier circuit is utilized in a partition supply voltage structure. An illustration of this structure is shown in FIG. 1, which is a schematic diagram of a conventional operational amplifier circuit utilizing a partition supply voltage structure. The operational amplifier circuit 10 comprises an operational amplifier OP1 and an operational amplifier OP2. The operational amplifier OP1 receives a first voltage VDD through a first power terminal PW1 and receives a second voltage VDD_H through a second power terminal PW2. The operational amplifier OP2 receives the second voltage VDD_H through the second power terminal PW2 and is coupled to ground GND through a third power terminal PW3. In such a condition, if the second voltage VDD_H is half the first voltage VDD, the operational amplifiers OP1 and OP2 are utilized in a half supply voltage structure: the operational amplifier circuit 10 is a half supply voltage operational amplifier. Supply voltage of the operational amplifier OP1 is within a range from the voltage VDD to the voltage ½ VDD. Supply voltage of the operational amplifier OP2 is within a range from the voltage ½ VDD to ground. In such a condition, the output interval of the operational amplifier OP1 is within a range from the voltage VDD to the voltage ½ VDD and the output interval of the operational amplifier OP2 is within a range from the voltage ½ VDD to ground. As a result, the power consumption of the operational amplifier circuit 10 can be significantly reduced.

Although the above circuit utilizing the partition supply voltage structure may reduce power consumption, the operational amplifier circuit may work abnormally due to the body effect. Please refer to FIG. 2, which is a schematic diagram of the operational amplifier OP1 shown in FIG. 1. As shown in FIG. 2, the operational amplifier OP1 comprises an output stage circuit 202. The output stage circuit 202 consists of a transistor NOUT and a transistor POUT, wherein the transistor NOUT and the transistor POUT are in a cascaded formation. The base of the transistor NOUT is coupled to the lowest voltage of the operational amplifier circuit 10 (i.e. to ground) and the supply voltage interval is within a range from the voltage VDD to the voltage ½ VDD (i.e. the source voltage of the transistor NOUT is ½ VDD). In such a condition, the transistor NOUT has the body effect, such that the threshold voltage of the transistor NOUT increases. For the output stage circuit 202, which is utilized for providing a huge current to drive post-stage loading in the operational amplifier OP1, the transistor NB1 may be cut off when the gate voltage of the transistor NOUT is significantly increased due to the serious body effect. As a result, the output current of the output stage 202 may be limited to an extremely small current, such that the operational amplifier OP1 works abnormally.

Please refer to FIG. 3, which is a schematic diagram of the operational amplifier OP2 shown in FIG. 1. As shown in FIG. 3, the operational amplifier OP2 consists of a transistor NOUT and a transistor POUT, wherein the transistor NOUT and the transistor POUT are in a cascaded formation. The base of the transistor POUT is coupled to the highest voltage of the operational amplifier circuit 10 (i.e. to the voltage VDD). Since the supply voltage interval of the operational amplifier OP2 is within a range from the voltage ½ VDD to ground, the source voltage of the transistor POUT is ½ VDD. In such a condition, the threshold voltage of the transistor POUT is increased due to the body effect. The transistor PB1 may be cut off when the gate voltage of the transistor POUT decreases significantly due to the serious body effect, such that the operational amplifier OP2 works abnormally.

In the prior art, an independent P-well and independent N-well provided by special processes are used for eliminating the body effect generated when utilizing the above partition supply voltage structure. Utilizing these special processes, however, causes the manufacturing cost of the integrated circuit to be greatly increased, which is not ideal for the designer of the integrated circuit. How to eliminate the body effect generated by utilizing the partition supply voltage structure without using the special processes has therefore become a problem to be solved in the industry.

SUMMARY OF THE INVENTION

Therefore, the present invention provides an output stage circuit utilized in a half supply voltage structure, which is capable of eliminating the body effect.

The present invention discloses an output stage circuit. The output stage circuit comprises a first transistor, comprising a first terminal coupled to a first node, a second terminal coupled to an output terminal, a third terminal coupled to an input terminal for receiving an input voltage, and a fourth terminal coupled to a first power terminal for receiving a first voltage; a second transistor, comprising a first terminal coupled to a second node, a second terminal coupled to the output terminal, a third terminal coupled to the input terminal for receiving the input voltage, and a fourth terminal coupled to ground; and a current source, coupled to the output terminal for providing a constant current.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
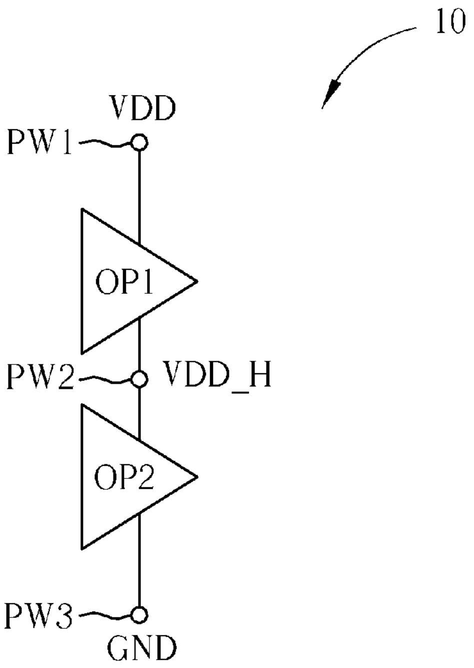
FIG. 1 PRIOR ART
FIG. 1 is a schematic diagram of a conventional operational amplifier utilizing the partition supply voltage structure.
Figure 2:
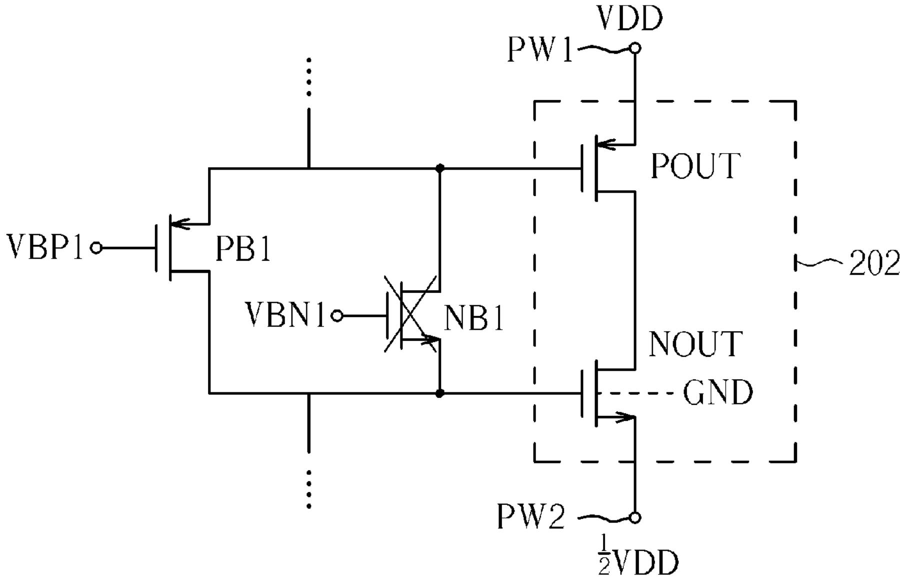
FIG. 2 PRIOR ART
FIG. 2 is a schematic diagram of the operational amplifier shown in FIG. 1.
Figure 3:
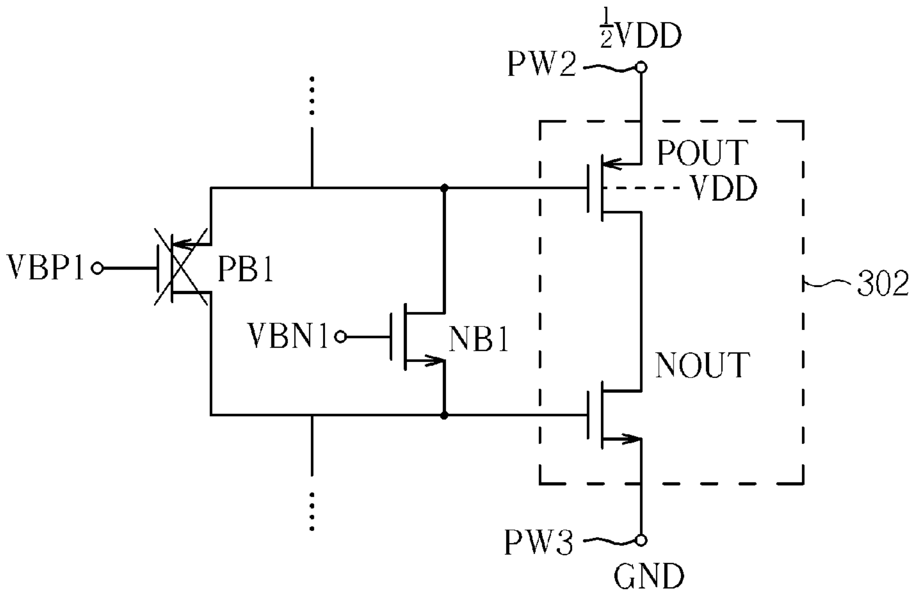
FIG. 3 PRIOR ART
FIG. 3 is another schematic diagram of the operational amplifier shown in FIG. 1.
Figure 4:
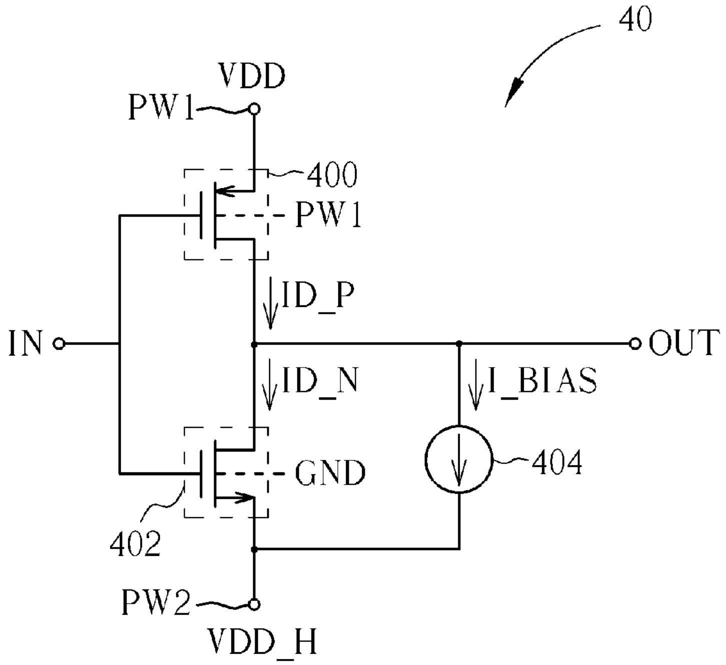
FIG. 4 is a schematic diagram of an output stage circuit according to an embodiment of the present invention.

Please refer to FIG. 4, which is a schematic diagram of an output stage circuit 40 according to an embodiment of the present invention. The output stage circuit 40 is an output stage circuit utilized in the operational amplifier OP1 shown in FIG. 1. It is assumed that the output stage circuit 40 is utilized in a half supply voltage structure and the supply voltage is within a range from the voltage VDD to the voltage ½ VDD, i.e. the second voltage VDD_H is the voltage ½ VDD. The output stage circuit 40 is utilized for outputting an output voltage VOUT according to an input voltage VIN of an input terminal IN, and transmitting the output voltage VOUT through an output terminal OUT. As shown in FIG. 4, the output stage circuit 40 comprises transistors 400 and 402 and a current source 404. The transistors 402 and 404 are cascaded. The transistor 400 is a P-type MOS, for providing a current ID_P to the output terminal OUT. The transistor 402 is an N-type MOS, for providing a current ID_N to the output terminal OUT. The sources of the transistors 400 and 402 are coupled to the first power terminal PW1 and a second power terminal PW2, respectively, for receiving the first voltage VDD and the second voltage VDD_H. The base of the transistors 400 and 403 are coupled to the first power terminal and ground, respectively. The current source 404 is a constant current source coupled to the output terminal OUT, for providing a constant current I_BIAS.

Since the base of the transistor 402 and the source of the transistor 402 respectively receive different voltages, the transistor 402 would have the body effect. The output stage circuit 40 needs to continuously generate a constant current when the input voltage VIN is at a normal biasing point. In such a condition, the transistor 402 is cut off. The required constant current is therefore provided by the constant current I_BIAS of the current source 404. When the input voltage VIN increases, the output voltage VOUT decreases. In such a condition, the transistor 402 is turned on for providing additional current to decrease the output voltage VOUT. As a result, the combination of the transistor 402 with the body effect and the current source 404 is equivalent to a transistor without the body effect. Via the co-operation of the transistor 402 and the current source 404, the output stage circuit 40 with the body effect can normally generate a biasing current, and the transient charging/discharging behavior thereof also works normally and has a driving capability not limited by said biasing current.

Further, since the present invention adds the current source 404 at the drain of the transistor 402 and the current source 404 replaces the transistor 402 to generate the constant current required when the output stage circuit 40 operates in a steady state, the transistor 402 is cut off when the output stage circuit 40 operates in the steady state. The gate voltage of the transistors 400 and 402 increases when the output stage circuit 40 needs to discharge an external loading, such that the transistor 402 is turned on for discharging. The discharging current is therefore not limited by the constant current I_BIAS generated by the current source 404. When the external loading is discharged to a certain voltage level, the gate voltage of the transistor 402 decreases to the original biasing point and cuts off the transistor 402. As can be seen above, the combination of the transistor 402 with the body effect and the current source is equivalent to a transistor without the body effect.

Figure 5A:
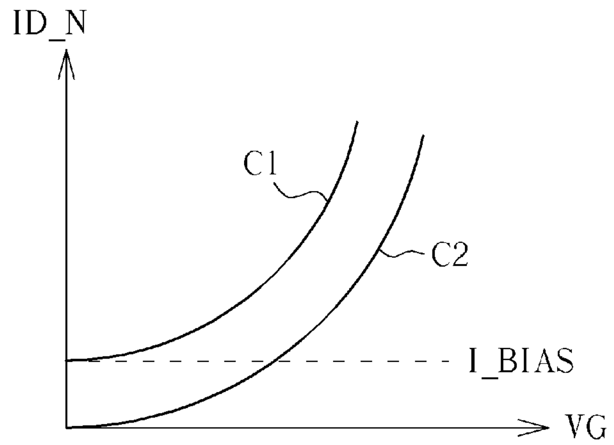
FIG. 5A and FIG. 5B are voltage-current characteristic diagrams of the transistor according to an embodiment of the present invention.
Figure 5B:
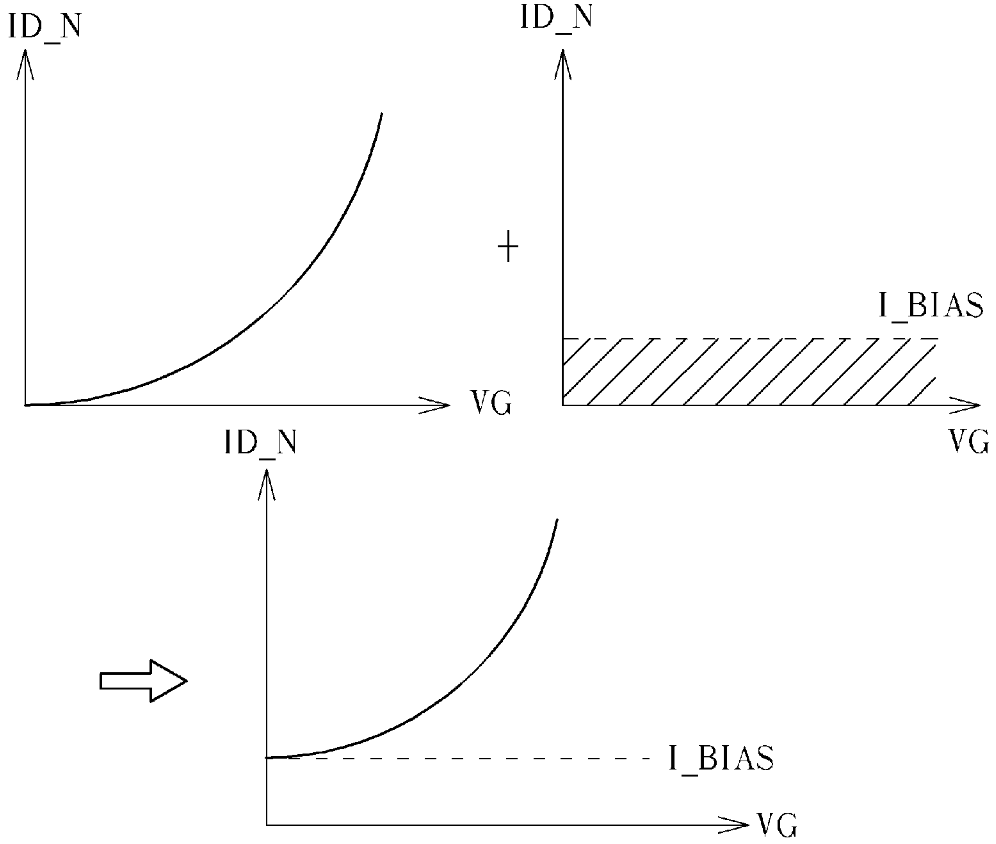

Please refer to FIG. 5A and FIG. 5B, wherein FIG. 5A is a voltage-current characteristic diagram of the transistor 402. A first curve C1 is a characteristic curve of the transistor 402 without the body effect. The second curve C2 is a characteristic curve of the transistor 402 with the body effect. As shown in the first curve C1, the transistor 402 generates a constant current I_BIAS when the transistor 402 is at the normal biasing point. The output current ID_N increases with the input voltage VIN. As shown in the second curve C2, the body effect results in the current of the transistor 402 being limited to an extremely small current when the transistor 402 is in the normal biasing point. The output stage circuit 40 therefore cannot work normally. Please refer to FIG. 5B. Via the current source 404 providing the constant current I_BIAS, the second curve C2 is shifted upward (i.e. configuring the current source 404) and the required biasing current of the output stage circuit 40 can be achieved. The second curve C2 is therefore equivalent to the first curve C1. The transient charging/discharging behavior of the combination of the current source and the transistor 402 with the body effect is equivalent to the transient charging/discharging behavior of transistor 402 without the body effect. In other words, through configuring the current source 404 in the output stage circuit 40, the output stage circuit 40 with the body effect can normally generate a biasing current and can provide driving capability without being limiting by the biasing current, such that the influence generated by the body effect can be eliminated.

Figure 6:
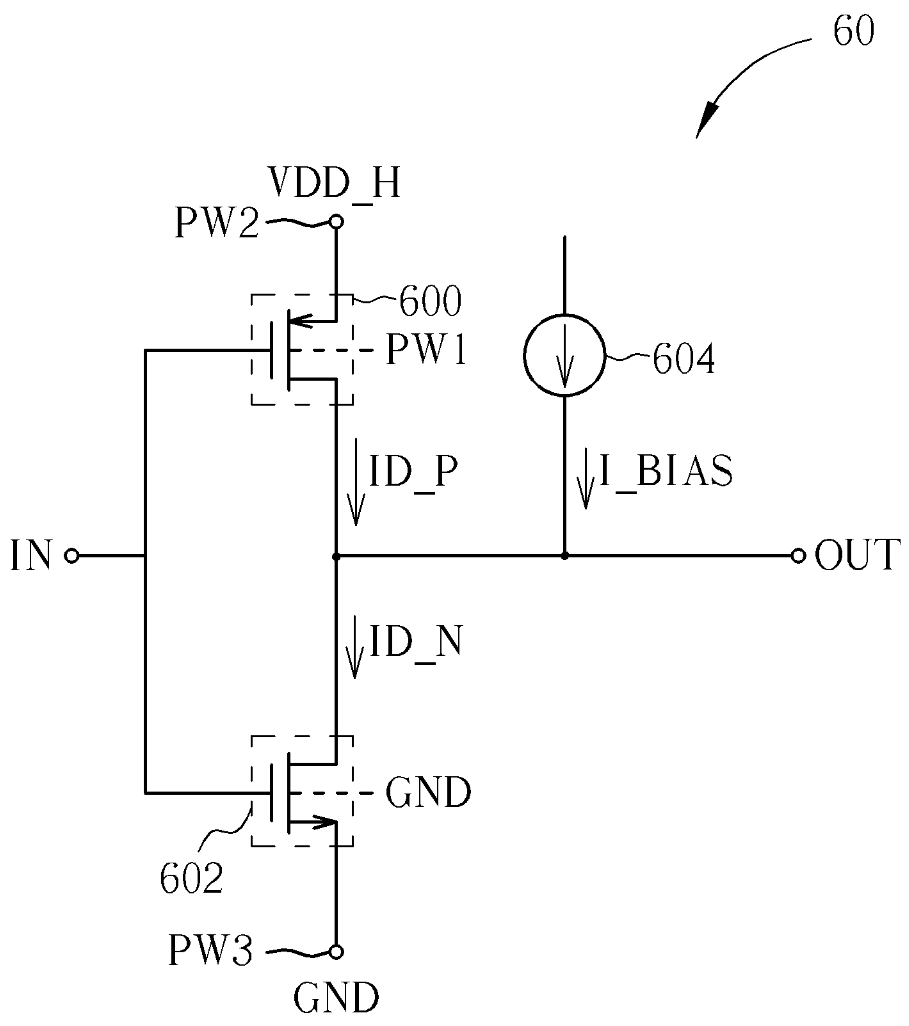
FIG. 6 is a schematic diagram of an output stage circuit according to another embodiment of the present invention.

Please refer to FIG. 6, which is a schematic diagram of an output stage circuit 60 according to another embodiment of the present invention. Since components annotated with the same numerals in FIG. 6 and in FIG. 4 have similar operational methods and functions, a detailed description and connecting methods thereof are not described herein for brevity. The output stage circuit 60 is an output stage circuit utilized in the operational amplifier OP2 shown in FIG. 1, for outputting an output voltage VOUT at an output terminal OUT according to an input voltage VIN of an input terminal IN. Assume the output stage circuit 60 is utilized in a half supply voltage structure, and the supply voltage is within a range from the voltage ½ VDD to ground, i.e. the second voltage VDD_H is the voltage ½ VDD. As shown in FIG. 6, the output stage circuit 60 comprises transistors 600 and 602 and a current source 604. The current source 604 is a constant current source coupled to the output terminal OUT, for providing a constant current I_BIAS. In contrast with the output stage circuit 40 shown in FIG. 4, the sources of the transistors 600 and 602 are coupled to the second power terminal PW2 and to ground, respectively, for receiving the second voltage VDD_H and ground voltage. The base of the transistors 400 and 403 are coupled to the first power terminal PW1 and to ground GND, respectively.

The output stage circuit 60 needs to provide a constant current when the input voltage VIN is at a normal biasing point. In such a condition, the transistor 600 is cut off and the required constant current is provided by the constant current I_BIAS generated by the current source 604. When the input voltage VIN decreases, the output voltage VOUT increases. In such a condition, the transistor 600 is turned on for providing additional current to increase the output voltage VOUT. The combination of the transistor 600 with the body effect and the current source 604 is equivalent to the transistor 600 without the body effect. Detailed charging/discharging behavior of the output stage circuit 60 can be known by referring to the description of the output stage circuit 40, and is therefore not described herein for brevity. Via the co-operation of the transistor 600 and the current source 604, the output stage circuit 60 can normally generate the biasing current and the charging/discharging behavior thereof can work normally when the output voltage circuit 60 is a half supply voltage. The driving capability of the output stage circuit 60 is therefore not limited by the biasing current.

The objective of the present invention is to eliminate the body effect of the output stage circuit utilized in a half supply voltage via configuring a constant current source in the output stage circuit. According to different applications, those skilled in the art can conceive appropriate alternations and modifications. For example, the gate of the transistor 400 and the gate of the transistor 402 can be coupled to different input terminals, as long as the output stage circuit 40 can generate the proper output voltage VOUT. Such modifications also fall within the scope of the present application.

To sum up, when operating in a half supply voltage structure, a prior art output stage circuit needs special process for providing an independent P-well and an independent N-well, in order to avoid the body effect. In comparison, the output stage circuit of the present application utilizes a constant current source for assisting operations of the output stage circuit, such that the output stage circuit with the body effect can normally generate a biasing current and charging/discharging behavior thereof will work normally when utilized in a half supply voltage structure. The driving capability of the output stage circuit of the present invention is therefore not limited by the biasing current. As a result, the output stage circuit of the present invention can completely eliminate the influence of the body effect. Moreover, the present invention does not need special processes for providing the independent P-well and N-well, thereby reducing manufacturing costs of the integrated chip.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An output stage circuit, comprising:

a first transistor, comprising a first terminal coupled to a first power terminal, a second terminal coupled to an output terminal, a third terminal coupled to an input terminal for receiving an input voltage, and a fourth terminal coupled to the first power terminal for receiving a first voltage;

a second transistor, comprising a first terminal coupled to a second power terminal for receiving a second voltage, a second terminal coupled to the output terminal, a third terminal coupled to the input terminal for receiving the input voltage, and a fourth terminal coupled to ground; and a current source, coupled to the output terminal for providing a constant current;

wherein the second voltage equals half the first voltage.

2. The output stage circuit of claim 1, wherein the second transistor is cut off when a voltage of the output terminal does not change.

3. The output stage circuit of claim 1, wherein the second transistor is turned on when a voltage of the output terminal decreases.

4. The output stage circuit of claim 1, wherein the first transistor is a P-type MOS, the first terminal of the first transistor is a source, the second terminal of the first transistor is a drain, the third terminal of the first transistor is a gate, and the fourth terminal of the first transistor is a base.

5. The output stage circuit of claim 1, wherein the second transistor is an N-type MOS, the first terminal of the second transistor is a source, the second terminal of the second transistor is a drain, the third terminal of the second transistor is a gate, and the fourth terminal of the second transistor is a base.

6. The output stage circuit of claim 1, wherein the first voltage is greater than a voltage of the output terminal and the voltage of the output terminal is greater than the second voltage.

7. An output stage circuit, comprising:

a first transistor, comprising a first terminal coupled to a first power terminal for receiving a first voltage, a second terminal coupled to an output terminal, a third terminal coupled to an input terminal for receiving an input voltage, and a fourth terminal coupled to a second power terminal for receiving a second voltage;

a second transistor, comprising a first terminal coupled to ground, a second terminal coupled to the output terminal, a third terminal coupled to the input terminal for receiving the input voltage, and a fourth terminal coupled to ground; and a current source, coupled to the output terminal for providing a constant current;

wherein the first voltage equals half the second voltage.

8. The output stage circuit of claim 7, wherein the first transistor is cut off when a voltage of the output terminal does not change.

9. The output stage circuit of claim 7, wherein the first transistor is a P-type MOS, the first terminal of the first transistor is a source, the second terminal of the first transistor is a drain, the third terminal of the first transistor is a gate, and the fourth terminal of the first transistor is a base.

10. The output stage circuit of claim 7, wherein the second transistor is an N-type MOS, the first terminal of the second transistor is a source, the second terminal of the second transistor is a drain, the third terminal of the second transistor is a gate, and the fourth terminal of the second transistor is a base.

11. The output stage circuit of claim 7, wherein the first voltage is greater than a voltage of the output terminal and the voltage of the output terminal is greater than ground.

12. An output stage circuit for an operational amplifier, comprising:

a pulling-up device, comprising a first terminal coupled to a first node, a second terminal coupled to an output terminal, and a third terminal coupled to an input terminal for receiving an input voltage, wherein the pulling device pulls up a voltage at the output terminal when the pulling-up device is conducted in response to the input voltage;

a pulling-down device, comprising a first terminal coupled to a second node, a second terminal coupled to the output terminal, a third terminal coupled to the input terminal for receiving the input voltage, and a fourth terminal coupled to a reference voltage, wherein the pulling-down device pulls down the voltage at the output terminal when the pulling-down device is conducted in response to the input voltage; and a current source, coupled to the output terminal for providing a constant current;

wherein a voltage of the second terminal is between a voltage of the first terminal and the reference voltage.

13. The output stage circuit of claim 12, wherein the pulling-up device further comprises a fourth terminal coupled to a power terminal for receiving a power voltage.

14. An output stage circuit for an operational amplifier, comprising:

a pulling-up device, comprising a first terminal coupled to a first node, a second terminal coupled to an output terminal, a third terminal coupled to an input terminal for receiving an input voltage, and a fourth terminal coupled to a power terminal for receiving a power voltage, wherein the pulling device pulls up a voltage at the output terminal when the pulling-up device is conducted in response to the input voltage;

a pulling-down device, comprising a first terminal coupled to a second node, a second terminal coupled to the output terminal, and a third terminal coupled to the input terminal for receiving the input voltage, wherein the pulling-down device pulls down the voltage at the output terminal when the pulling-down device is conducted in response to the input voltage; and a current source, coupled to the output terminal for providing a constant current;

wherein a voltage of the first node is between the power voltage and a voltage of the second node.

15. The output stage circuit of claim 14, wherein the pulling-down device further comprises a fourth terminal coupled to a reference voltage.

* * * * *